United States Patent [19]

Kanai

[11] 4,388,397

[45] Jun. 14, 1983

[54] PHOTOSENSITIVE COMPOSITION FOR DRY DEVELOPMENT

[75] Inventor: Wataru Kanai, Samukawa, Japan

[73] Assignee: Tokyo Ohka Kogyo Kabushiki Kaisha, Kawasaki, Japan

[21] Appl. No.: 248,325

[22] Filed: Mar. 27, 1981

[30] Foreign Application Priority Data

Mar. 29, 1980 [JP] Japan .................... 55-39673

[51] Int. Cl.³ .............. G03C 1/71; G03C 1/70; G03C 1/60
[52] U.S. Cl. ............... 430/197; 430/167; 430/194; 430/313; 430/323; 430/325; 430/908; 430/927
[58] Field of Search ........... 430/197, 192, 286, 919, 430/927, 280, 281, 167, 323, 325, 908, 313

[56] References Cited

U.S. PATENT DOCUMENTS

| | | | |
|---|---|---|---|
| 2,852,379 | 9/1958 | Hepher | 430/197 |
| 3,118,765 | 1/1964 | Leonard et al. | 430/197 |
| 3,260,599 | 7/1966 | Lokken | 430/152 |
| 3,718,474 | 2/1973 | Kolb et al. | 430/197 |
| 4,018,937 | 4/1977 | Levine et al. | 430/28 C |
| 4,091,194 | 5/1978 | Schlesinger | 430/176 |
| 4,197,133 | 4/1980 | Zweifel et al. | 430/286 |
| 4,241,165 | 12/1980 | Hughes et al. | |
| 4,297,433 | 10/1981 | Tsuda et al. | 430/296 |
| 4,299,911 | 11/1981 | Ochi et al. | 430/325 |

FOREIGN PATENT DOCUMENTS

| | | |
|---|---|---|
| 52-113163 | 9/1977 | Japan . |
| 52-122235 | 10/1977 | Japan . |
| 54-65037 | 5/1979 | Japan . |
| 850954 | 10/1960 | United Kingdom ........ 430/197 |

OTHER PUBLICATIONS

Iwayanagi, T. et al., J. Electrochem. Soc., vol. 127, No. 12, pp. 2759-2760, 430-197, 12/1980.
Asano, T., Tokyo Symposium '77 on Photo and Electro-Imaging, Tokyo, pp. 241-248, 9/1977.

*Primary Examiner*—Charles L. Bowers, Jr.
*Attorney, Agent, or Firm*—Armstrong, Nikaido, Marmelstein & Kubovcik

[57] ABSTRACT

A novel photosensitive composition for dry development in the ultra-fine pattern formation of the semiconductor industry, which is composed of at least one of acrylic and vinyl ketone polymers and a specified subliming bisazide compound as a photocuring agent, is disclosed.

The use of the photosensitive composition provides a very effective ultra-fine pattern formation process in the semiconductor industry with such advantages that unexposed areas are selectively removable by treating with a plasma, and consequently plasma development becomes available so that high resolution may easily be obtained. Automating and dry processing of all the stages ranging from development processing to stripping processing become available when using the photosensitive composition of this invention. No expensive treating reagents are needed and environmental pollution is eliminated.

8 Claims, No Drawings

PHOTOSENSITIVE COMPOSITION FOR DRY DEVELOPMENT

BACKGROUND OF THE INVENTION

1. Field of the Invention

This invention relates to a novel photosensitive composition for dry development in the ultra-fine pattern formation in the semiconductor industry. More particularly, this invention relates to a novel photosensitive composition prepared by adding a bisazide compound to a polymer for giving photo-sensitive properties thereto, said photosensitive composition being suitable for plasma development.

2. Description of the Prior Art

A process for the preparation of semiconductor elements includes photolithography, which comprises: (a) coating a photoresist as a thin film having a thickness of about 1 micron (which will be a resistive film during etching) on a silicon wafer having a silicon oxide, silicon nitride or polysilicon layer having a thickness of thousands of angstroms, (b) irradiating said film with ultraviolet light through a predetermined photo-mask, (c) developing, (d) rinsing, (e) effecting etching of the silicon oxide layer or the like, (f) removing the photoresist, (g) rinsing the wafer well, and (h) allowing an impurity to diffuse through the exposed area of silicon to be implanted thereinto. The semiconductor elements are manufactured by repeating the above photolithography several times followed by the preparation of electrodes and wirings.

Examples of photoresists currently used in the ultra-fine pattern formation of the semiconductor industry include cyclized rubber type negative photoresists such as OMR marketed by Tokyo Ohka Kogyo Co., KMR marketed by Eastman Kodak Co., and Waycoat, marketed by Hunt Chemical Corp.; novolak-type positive photoresists such as OFPR marketed by Tokyo Ohka Kogyo Co., AZ marketed by Shipley Co., KMPR marketed by Eastman Kodak Co., and HPR marketed by Hunt Chemical Corp.

In the process for the preparation of semiconductor elements, the photoresists known in the art are all subjected to wet development and rinse processing to be used as a mask for etching the silicon oxide layer or the like with hydrofluoric acid etching solution and are stripped by use of a stripper, or with an oxygen plasma in a special case. However, selective stripping of the photoresist to exposed areas or unexposed areas by use of an oxygen plasma in the case where the photoresist is exposed to light through a photo-mask (that is, dry development) has never become available prior to the instant invention.

In the conventional plasma processing, oxygen gas is introduced into an evacuated bell jar at a pressure of from 10 to 0.1 Torr. This is followed by the application of a high radio frequency (RF) and high voltage thereto to form a plasma such as an ion, atom or radical of the introduced oxygen gas. The polymer used as the photoresist is decomposed when exposed to the resulting plasma.

The use of an organic solvent in the conventional wet development and rinse processing causes problems, such as a hazardous working atmosphere and a long processing time. Photoresists, especially the negative photoresists, swell so markedly in the developing solution that resolution is impaired.

SUMMARY OF THE INVENTION

An object of this invention is to provide a novel photosensitive composition for dry development suitable for plasma development in ultra-fine pattern formation of the semiconductor industry.

Another object of this invention is to provide a novel photosensitive composition for dry development, which is capable of easily producing high resolution and which is adaptable to automation and dry processing at all the stages ranging from development processing to stripping processing without employing expensive treating reagents and organic solvents, and thereby eliminates environmental pollution caused by use of treating reagents and organic solvents.

A further object of this invention is to provide a novel photosensitive composition for dry development which makes it possible to easily remove unexposed areas by plasma processing.

The above objects of this invention are achieved by use of the following photosensitive composition for dry development.

A photosensitive composition for dry development comprising at least one of acrylic and vinyl ketone polymers (hereinafter referred to simply as polymers), and a subliming bisazide compound as a photocuring agent represented by the general formula:

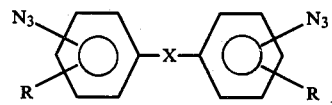

where R is a hydrogen or halogen atom, and X is an oxygen atom, carbonyl group, methylene group, sulfur atom, disulfide group or sulfone group.

DETAILED DESCRIPTION OF THE INVENTION

In accordance with the photosensitive composition of the present invention, after the photoresist is exposed to light through a photomask, removal of the photocuring agent from unexposed areas in an appropriate manner, such as drawing a vacuum, heating or a combination thereof, enables the easy decomposition of the unexposed areas by use of a plasma, and consequently dry processing comparable to the conventional wet development and rinse processing. Thus, the unreacted photocuring agent can be removed from the photoresist selectively exposed to light to effect plasma development by making use of difference in physical properties therebetween because of difference in the degree of crosslinking between the exposed areas and unexposed areas.

The bisazide compounds represented by the aforesaid general formula are preferably used as the subliming (or sublimable) photocuring agent in the present invention. Examples of the bisazide compound include 4,4'-diazidodiphenyl ether, 4,4'-diazidodiphenyl methane, 4,4'-diazidodiphenyl sulfide, 4,4'-diazidodiphenyl disulfide, 4,4'-diazidodiphenyl sulfone, 3,3'-diazidodiphenyl sulfone, 3,3'-dichloro-4,4'-diazidodiphenyl methane and the like.

The polymer used in the present invention should be so selected that high resolution can be obtained by a combination thereof with the photocuring agent and that the polymer can be readily decomposed by ashing under a plasma atmosphere. The acceptable polymer is preferably an acrylic and/or a vinyl ketone polymer, which is nonviscous and easily handled and has a high resistance to plasma etching when present as a dry thin film. Polymers which are useful in the present invention include homopolymers such as polymethylisopropenyl ketone, polymethyl methacrylate, polyisopropyl vinyl ketone, poly-n-butyl acrylate, polyphenyl vinyl ketone and polyglycidyl methacrylate; and copolymers, such as a copolymer of isopropyl vinyl ketone and methyl vinyl ketone, and a copolymer of n-butyl methacrylate and methyl acrylate.

The molecular weight of the aforesaid polymer is preferably in the range of from tens of thousands to two million, more preferably hundreds of thousands to one million.

If the molecular weight of the polymer is greater than two million, an uneven coating results when a solution of polymer and photocuring agent in a solvent is applied to a surface (e.g., a silicon wafer) via a spinner. On the other hand, when the molecular weight of the polymer is less than tens of thousands, the resistance to plasma is poor.

The aforesaid polymer and the bisazide compound are dissolved in a solvent such a cyclohexanone, ethyl cellosolve acetate, xylene, 2-nitropropane, methyl cellosolve acetate, 2-hexanone and toluene, or a mixture thereof to be coated on a silicon wafer. The wafer coated with the photosensitive solution is then dried and exposed to an appropriate radiation such as ultraviolet radiation through a predetermined photomask and placed in a commercially available plasma generator where it (the irradiated coated wafer) is subjected to development processing under an oxygen plasma atmosphere within about 5 minutes, which is less time than required by conventional wet development and rinse processing.

The amount of the bisazide compound used as the photocuring agent in the photosensitive composition of the present invention is preferably in the range of from 5 to 30% by weight based on the amount of the polymer, more preferably 15 to 25% by weight. When the aforesaid amount is less than 5% by weight, a percent retention (%) of the resist thickness after development to the initial resist thickness is unfavorably decreased. When the aforesaid amount is more than 30% by weight, crystals of the bisazide compound added thereto precipitate in the photosensitive solution or deposit on the surface of the film which is coated on the wafer. The aforesaid polymer is dissolved in the solvent in an amount of from 3 to 20 parts by weight, preferably 5 to 15 parts by weight based on 100 parts by weight of the solvent.

The dry development conditions according to the present invention largely depend on the specifications of the plasma apparatus to be employed, particularly on the RF power, the temperature of the wafer table, the gas pressure, the kind of gas, the flow rate of the gas. For example, when oxygen gas is employed, the preferable conditions are such that the RF power ranges from 50 to 250 W, the temperature of the wafer table ranges from 80° to 150° C., and the gas pressure ranges from 0.1 to 10 Torr, preferably 0.5 to 2 Torr. The flow rate of the gas is preferably determined depending on the exhaust capacity of the vacuum pump fitted in the plasma apparatus and on the capacity of the plasma reaction chamber.

The use of the photosensitive composition comprising the aforesaid polymer and the bisazide compound as the photocuring agent in the present invention makes it possible to selectively remove the unexposed areas by use of a plasma wherein oxygen is used as plasma gas, and consequently to effect dry development. This results in a very effective ultra-fine pattern formation process for use in the semiconductor industry wherein: (a) high resolution can easily be obtained, (b) automating of the plasma development processing is available so that expensive treating reagents are not needed, and (c) environmental pollution is eliminated. After the dry development, a substrate can be subjected to plasma etching by replacing the oxygen plasma gas with a second plasma gas or vapor, such as $CF_4$, $C_3F_8$, $CF_3Cl$, $CF_2Cl_2$, $CCl_4$ or the like, followed by plasma ashing for removal of the photoresist by replacing the second plasma gas or vapor with oxygen gas. Thus, with the composition of the instant invention, automating and dry processing of all the stages ranging from the development processing stage to the stripping processing stage become available.

The present invention will be described more in detail by the following Examples, which are not to be construed as limiting.

EXAMPLE 1

5 g of polymethyl isopropenyl ketone having a molecular weight of 180,000 and one gram of 4,4'-diazidodiphenyl ether are dissolved in 50 g of cyclohexanone to obtain a photosensitive solution. The photosensitive solution is spincoated onto a silicon wafer at a rotation of 3000 rpm for 30 seconds, and the coated wafer is placed in an oven at a temperature of from 60° to 70° C. for 20 minutes to evaporate the residual organic solvent (i.e., to dry the coating on the wafer). Thereafter, 20 counts of a light having a wavelength of from 250 to 300 nm is irradiated on the resulting coated and dried wafer through a mask (a deep UV Mask Aligner PLA-520F fitted with CM-250 cold mirror, marketed by Canon Inc.), wherein one count corresponds to an amount of energy irradiated for 0.85 second with a super high pressure mercury lamp having a 500 w power. The thus obtained wafer (the irradiated wafer) is subjected to post baking in an oven at a temperature of from 140° to 160° C. for 20 minutes. Unreacted diazide compound completely sublimes out of the photoresist film during the post baking.

Thereafter, the resulting post baked wafer is placed in a plasma process apparatus (marketed by Tokyo Ohka Kogyo Co., product name OAPM-310B), and subjected to plasma development in an atmosphere of oxygen plasma for 2 minutes under the conditions of a RF power of 80 W, a radio frequency of 13.56 MHz, a pressure of 1.0 Torr, an oxygen flow rate of about 100 ml/min. and a wafer table temperature of 100° C.

Thus, the photoresist coated film initially has a thickness of 1.0 micron, and the residual film after development has a thickness of 0.6 micron, resulting in having a resolution of 0.5 micron. The above result shows that the photoresist of the present invention is quite comparable to that in the most improved wet process currently available in the semiconductor industry. After the completion of the plasma development stage, the plasma gas (oxygen) is replaced for etching the substrate. $CF_4$ gas is used for etching silicon as the substrate. Etching is effected for 3 minutes under such conditions that a 200 W power is used, that the temperature of the wafer table, on which the wafer is placed, is 100° C., and that the gas pressure in the reaction chamber is 0.3 Torr.

The etching by using a resist pattern resulting from dry development by the procedures described as above as a mask enables the substrate to be etched with high precision.

After the completion of etching, $CF_4$ gas is replaced by oxygen to effect plasma treatment under the conditions of a 200 W power, a wafer table temperature of 100° C., and an oxygen gas flow rate of 250 ml/min. so that the photoresist may be removed in about one and half minutes.

EXAMPLE 2

5 g of polymethyl methacrylate having a molecular weight of 600,000 and one gram of 4,4'-diazidodiphenyl methane are dissolved in 50 g of ethyl cellosolve acetate to obtain a photosensitive solution. The photosensitive solution is coated to form a film, exposed to light and subjected to post baking for 20 minutes in an oven at a temperature of from 140° to 160° C. in the same manner as in Example 1. Thereafter, the temperature of the wafer table is set at 120° C., and the wafer is placed in the plasma process apparatus as in Example 1 to be subjected to development processing for 4 minutes under the conditions of a RF power of 150 W, a radio frequency of 13.56 MHz and an oxygen pressure of 1.5 Torr. The thickness of the coated film is decreased from 1 micron to 0.5 micron, resulting in having a resolution of 0.5 micron.

Thereafter, a substrate obtained by forming a polysilicon layer to a thickness of 4000 Å on a silicon wafer having a $SiO_2$ film is subjected to etching by using a development pattern resulting from the processing as above a mask. Etching of the polysilicon layer is effected for about one minute by the use of a gaseous mixture composed of 95 parts by volume of $CF_4$ gas and 5 parts by volume of oxygen under the conditions of a 200 W power, a gas pressure of 1 Torr, and a wafer table temperature of 120° C. to be etched with high precision.

Subsequently, the gaseous mixture is replaced by oxygen to remove completely the photoresist in about 2 minutes by treating under the conditions of a 200 W power, a gas pressure of 2.5 Torr, and a wafer table temperature of 120° C.

EXAMPLE 3

5 g of polyisopropyl vinyl ketone having a molecular weight of 80,000 and one gram of 4,4'-diazidodiphenyl sulfide are dissolved in 50 g of cyclohexanone to obtain a photosensitive solution. The photosensitive solution is coated to form a film, exposed to light and subjected to post baking in the same manner as in Example 1. Thereafter, the temperature of the wafer table is set at 100° C., and the wafer is placed in the plasma process apparatus as in Example 1 to be subjected to development processing for 5 minutes under the conditions of a RF power of 100 W, a radio frequency of 13.56 MHz, and an oxygen pressure of 1.2 Torr with the result that the percent retention (%) of the resist thickness after development to the initial resist thickness is 60%, resulting in having a resolution of 0.5 micron.

EXAMPLE 4

5 g of poly-n-butyl acrylate having a molecular weight of 230,000 and one gram of 4,4'-diazidodiphenyl sulfone are dissolved in 50 g of cyclohexanone to obtain a photosensitive solution. The photosensitive solution is coated to form a film, exposed to light and subjected to post baking in the same manner as in Example 1. Thereafter, the temperature of the wafer table is set at 80° C., and the wafer is placed in the plasma process apparatus as in Example 1 to be subjected to development processing for 5 minutes under the conditions of a RF power of 100 W, a radio frequency of 13.56 MHz and an oxygen pressure of 1.2 Torr, the resolution being 0.5 micron.

EXAMPLE 5

5 g of a copolymer of isopropyl vinyl ketone and methyl vinyl ketone having a molecular weight of 330,000 and one gram of 3,3'-diazidodiphenyl sulfone are dissolved in 50 g of cyclohexanone to obtain a photosensitive solution. The photosensitive solution is coated on a silicon wafer to be subjected to thermal oxidation processing and dried. Thereafter 25 counts of the light is irradiated on the resulting coated wafer through a test pattern by use of the Mask Aligner as in Example 1. The resulting wafer is baked for 20 minutes in an oven at 150° C. and then placed in the plasma process apparatus as in Example 1 to be exposed to the oxygen plasma generated under the conditions of a RF power of 200 W, a radio frequency of 13.56 MHz, a wafer table temperature of 100° C. and an oxygen pressure of 0.8 Torr for development.

The coated film initially having a thickness of one micron is decreased to 0.5 micron, resulting in having a resolution of 0.5 micron.

EXAMPLE 6

5 g of a copolymer of n-butyl methacrylate and methyl acrylate having a molecular weight of 450,000 and one gram of 4,4'-diazidodiphenyl disulfide are dissolved in 50 g of ethyl cellosolve acetate to obtain a photosensitive solution. The photosensitive solution is coated on a silicon wafer subjected to thermal oxidation processing to form a film having a thickness of one micron. The resulting wafer is exposed to light through a quartz test pattern for baking 30 minutes at 150° C. The wafer thus obtained is placed in the plasma process apparatus as in Example 1 to be subjected to development processing for 4 minutes under the conditions of a RF power of 100 W, a radio frequency of 13.56 MHz, a wafer table temperature of 100° C. and an oxygen pressure of 1.0 Torr. A resolution of 0.5 micron is achieved and the resulting film has a thickness of 0.4 micron.

EXAMPLE 7

5 g of polyphenyl vinyl ketone and one gram of 3,3'-dichloro-4,4'-diazidodiphenyl methane are dissolved in 50 g of cyclohexanone to obtain a photosensitive solution. The photosensitive solution is coated on a silicon wafer to form a film in the same manner as in Example 1. Thereafter, 25 counts of a light is irradiated on the coated film through a mask for a test pattern by use of the Mask Aligner as in Example 1 for baking at 140° C. for 30 minutes so that the bisazide compound may sublime to be removed. The resulting wafer is subjected to plasma development for 5 minutes under the conditions of a wafer table temperature of 120° C., a RF power of 150 W, a radio frequency of 13.56 MHz and an oxygen pressure of 1.0 Torr, the resolution obtained being 0.5 micron.

EXAMPLE 8

To a solution prepared by dissolving 5 g of polymethyl isopropenyl ketone having a molecular weight of 330,000 in 50 g of cyclohexanone, 1.5 g and 0.5 g of 4,4'-diazidodiphenyl sulfide are added to obtain photosensitive solutions (A) and (B) respectively. The photosensitive solutions (A) and (B) are coated on a silicon wafer to form a film as in Example 1. Thereafter, 20 and 30 counts of the light are irradiated by use of the Mask Aligner as in Example 1 on the films formed from the photosensitive solutions (A) and (B), respectively. Thereafter, the respective wafers are baked in an oven at 140° C. for 30 minutes and subjected to plasma development for 2 minutes under the conditions of a RF power of 100 W, a radio frequency of 13.56 MHz, a wafer table temperature of 100° C., and an oxygen pressure of 1.0 Torr.

The resulting films from the photosensitive solutions (A) and (B) initially have a thickness of 1.0 micron, respectively. After development processing, the film formed from the photosensitive solution (A) has a thickness of 0.6 micron, while one from the photosensitive solution (B) has a thickness of from 0.3 to 0.4 micron. A resolution of 0.5 micron is achieved, respectively.

The above results show that the percent retention (%) of the resist thickness after development to the initial resist thickness varies as the amount of the bisazide compound to be added varies within the range of from 5 to 30% by weight thereof based on the amount of the polymer.

COMPARATIVE EXAMPLE 1

The procedures of Example 1 are repeated except that 2 g of 4,4'-diazidodiphenyl ether is used with the result that crystals of 4,4'-diazidodiphenyl ether deposit on the surface of the coated film to be shown unfavorable for preparing an ultra-fine pattern.

On the other hand, in the case where 0.4 g of 4,4'-diazidodiphenyl ether is used, no deposition thereof is formed; but the present retention (%) of the resist thickness after development to the initial resist thickness is 10% to be unable to stand the subsequent etching processing.

COMPARATIVE EXAMPLE 2

The procedures of Example 1 are repeated except that no post baking processing is effected with the result that no selectivity to plasma between the exposed areas and the unexposed areas is found and no pattern can be obtained.

What is claimed:

1. In a photosensitive composition for dry development comprising a polymer and a subliming bisazide compound as a photocuring agent, the improvement comprising:
    (a) selecting as the polymer, polyglycidyl methacrylate, and
    (b) selecting the subliming bisazide compound from subliming bisazide compounds of the formula:

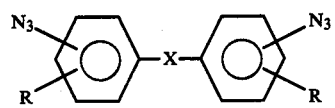

where R is a hydrogen or a halogen atom and X is an oxygen atom, a carbonyl group, a methylene group, a sulfur atom, a disulfide group or a sulfone group.

2. A composition as claimed in claim 1 wherein said polymer has a molecular weight of from tens of thousands to two million.

3. A composition as claimed in claim 1 wherein said polymer has a molecular weight of from hundreds of thousands to one million.

4. A composition as claimed in claim 1 wherein said biszaide compound is a member selected from the group consisting of 4,4'-diazidodiphenyl ether, 4,4'-diazidodiphenyl methane, 4,4'-diazidodiphenyl sulfide, 4,4'-diazidodiphenyl disulfide, 4,4'-diazidodiphenyl sulfone, 3,3'-diazidodiphenyl sulfone and 3,3'-dichloro-4,4'-diazidodiphenyl methane.

5. A composition as claimed in claim 1 wherein said bisazide compound is used in an amount of from 5 to 30% by weight based on the amount of the polymer.

6. A composition as claimed in claim 1 wherein said bisazide compound is used in an amount of from 15 to 25% by weight based on the amount of the polymer.

7. The composition of claim 1 in which R is hydrogen and X is a carbonyl group.

8. The composition of claim 7 in which the $N_3$ groups respectively are in the 4- and 4'-positions.

* * * * *